(12) United States Patent
Watchko et al.

(10) Patent No.: US 6,763,576 B2
(45) Date of Patent: Jul. 20, 2004

(54) MANUFACTURE OF ELECTRONICS ENCLOSURE HAVING A METALLIZED SHIELDING LAYER

(75) Inventors: George R. Watchko, Stoneham, MA (US); Brian F. Flaherty, Stoneham, MA (US); Matthew T. Gagnon, Topsfield, MA (US); Douglas Nobbs, Dover, NH (US); Steven L. Thornton, Windham, NH (US); Walter H. Dolbier, Jr., Concord, MA (US); George A. Lee, Wellesley, MA (US); James J. Sauer, Holliston, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 293 days.

(21) Appl. No.: 10/137,229

(22) Filed: May 1, 2002

(65) Prior Publication Data

US 2002/0166682 A1 Nov. 14, 2002

Related U.S. Application Data

(60) Provisional application No. 60/289,920, filed on May 10, 2001.

(51) Int. Cl.$^7$ .............................................. H05K 43/00
(52) U.S. Cl. ........................ 29/825; 29/831; 174/35 R; 174/52.2; 174/52.4
(58) Field of Search ........................ 29/825, 840, 831, 29/832; 174/52.2, 52.4, 35 R

(56) References Cited

U.S. PATENT DOCUMENTS

| | | |
|---|---|---|
| 2,778,868 A | 1/1957 | Stinger |
| 4,227,037 A | 10/1980 | Layton |
| 4,435,565 A | 3/1984 | Stirling et al. |
| 4,545,926 A | 10/1985 | Fouts, Jr. et al. |
| 4,652,695 A | 3/1987 | Busby |
| 4,714,623 A | 12/1987 | Riccio et al. |
| 4,777,565 A | 10/1988 | McIntosh |
| 4,780,575 A | 10/1988 | Flavin et al. |
| 4,847,903 A | 7/1989 | Clarke |
| 4,857,668 A | 8/1989 | Buonanno |
| 4,952,448 A | 8/1990 | Bullock et al. |
| 5,008,485 A | 4/1991 | Kitagawa |
| 5,020,866 A | 6/1991 | McIllwraith |
| 5,028,739 A | 7/1991 | Keyser et al. |
| 5,039,825 A | 8/1991 | Samarov |
| 5,045,635 A | 9/1991 | Kaplo et al. |
| 5,047,260 A | 9/1991 | Durand |
| 5,105,056 A | 4/1992 | Hoge, Jr. et al. |
| 5,142,101 A | 8/1992 | Matsuzaki et al. |
| 5,147,121 A | 9/1992 | McIllwraith |
| 5,150,282 A | 9/1992 | Tomura et al. |

(List continued on next page.)

FOREIGN PATENT DOCUMENTS

| DE | 197 28 839 C1 | 9/1998 |
|---|---|---|
| EP | 0 654 962 A1 | 11/1994 |

(List continued on next page.)

OTHER PUBLICATIONS

International Application Published Under the PCT, International Publication No. WO00/29635.
International Application Published Under the PCT, International Publication No. WO96/22672.

(List continued on next page.)

Primary Examiner—Carl J. Arbes
(74) Attorney, Agent, or Firm—John A. Molnar, Jr.

(57) ABSTRACT

Manufacture of an electromagnetic interference (EMI) shielding cover or other enclosure part for housing circuitry of an electronic device. The enclosure part has an exterior surface and an opposing interior surface metallized with an electrically-conductive EMI shielding layer. The layer is sprayed onto the interior surface in a molten state and is solidified to form a corrosion-resistant, self-adherent coating.

25 Claims, 4 Drawing Sheets

U.S. PATENT DOCUMENTS

| | | | |
|---|---|---|---|
| 5,160,807 A | 11/1992 | Fry et al. | |
| 5,166,864 A | 11/1992 | Chitwood et al. | |
| 5,170,009 A | 12/1992 | Kadokura | |
| 5,180,639 A | 1/1993 | Zarnoch | |
| 5,185,654 A | 2/1993 | Mosher et al. | |
| 5,202,536 A | 4/1993 | Buonanno | |
| RE34,393 E | 9/1993 | McIllwraith | |
| 5,260,513 A | 11/1993 | Giles et al. | |
| 5,326,414 A | 7/1994 | Mosher et al. | |
| 5,442,153 A | 8/1995 | Marantz et al. | |
| 5,489,489 A | 2/1996 | Swirbel et al. | |
| 5,566,055 A | 10/1996 | Salvi, Jr. | |
| 5,578,790 A | 11/1996 | Peregrim | |
| 5,641,438 A | 6/1997 | Bunyan et al. | |
| 5,678,699 A | 10/1997 | Gebka | |
| 5,731,541 A | 3/1998 | Bernd et al. | |
| 5,811,050 A | 9/1998 | Gabower | |
| 5,847,317 A | 12/1998 | Phelps | |
| 5,882,729 A | 3/1999 | Kahl et al. | |
| 5,910,524 A | 6/1999 | Kalinoski | |
| 6,054,647 A * | 4/2000 | Ridener | 174/35 MS |
| 6,096,158 A | 8/2000 | Kahl et al. | |
| 6,096,413 A | 8/2000 | Kalinoski et al. | |
| 6,121,545 A | 9/2000 | Peng et al. | |
| 6,188,174 B1 | 2/2001 | Marutsuka | |
| 6,483,719 B1 * | 11/2002 | Bachman | 361/816 |
| 6,570,085 B1 * | 5/2003 | Gabower | 174/35 MS |
| 6,624,432 B1 * | 9/2003 | Gabower et al. | 250/515.1 |

FOREIGN PATENT DOCUMENTS

| | | |
|---|---|---|
| EP | 0802710 A2 * | 10/1997 |
| EP | 0 813 805 B1 | 9/1998 |
| EP | 1 059 368 A2 | 6/2000 |
| JP | 4023497 | 1/1992 |
| JP | 5-7177 | 1/1993 |
| JP | 293989 | 11/1997 |
| JP | 11032824 | 2/1999 |
| JP | 11121964 | 4/1999 |

OTHER PUBLICATIONS

International Application Published Under the PCT, International Publication No. WO97/26782.
International Application Published Under the PCT, International Publication No. WO98/47340.
Chomerics Preliminary Product Data Sheet for ChoShield® 256.
Chomerics Cho–Shield Conductive Cloatings.
Chomerics Technical Bulletin 22.
Chomerics Technical Bulletin for Cho–Ver Shield.
Chomerics Technical Bulleting 48.
Chomerics Cho–Ver Shield Covers.
Chomerics Cho–Form® Automated Form–in–Place EMI Gasketing Technology.
Chomerics Conductive Elastomer EMI Shielding/Grounding Spacer Gaskets.
Chomerics Cho–Form Robotically Dispensed Form–inPlace EMI Gasketing.
Chomerics Preliminary Product Data Sheet Cho–Shield® 2054.
Chomerics Preliminary Product Data Sheet Cho–Shield® 2056.
International Application Published Under the PCT, International Publication No. WO98/54942.
International Application Publsihed Under the PCT, International Publication No. WO99/40769.
International Application Published Under the PCT, International Publication No. WO99/43191.
Chomerics, Parker–Hannifin Corp., brochure entitled "EMI Shielding and Grounding Spacer Gaskets" dated 1996.
Processing of Single and Multi–component Adhesives and Sealants by Paul Ivanfi, together with translation (undated).
Chomerics Parker–Hannifin Corp. Technical Bulletin 22 entitled "Cho–Shield EMI Shielding Covers" dated 1996.
Parker Seals article entitled "Parishield Conductive Elastomers" dated 1993.
Article by Shu H. Peng and W. S. Vicent Teng of Chomerics Parker–Hannifin Corporation entitled "Recent Development in Elastomeric EMI Shielding Gasket Design" (undated).
Copy of Patent Application Ser. No. 60/183,395 filed Feb. 18, 2000 and assigned to Parker–Hannifin Corporation, entitled "Manufacture of Low Closure Force, Form–inPlace EMI Shielding Gasket".
TAFA® Technical Data Issue No. D11206 for TAFA Tiecoat™—A Bond Coat for Plastics, copyrighted 1988.
Article entitled Bond Coat Prepares Plastic for Metallizing by David J. Bak.
Article entitled Plasma for Cleaning/Etching copyrighted 1977 by March Instruments, Inc.

* cited by examiner

MANUFACTURE OF ELECTRONICS ENCLOSURE HAVING A METALLIZED SHIELDING LAYER

CROSS-REFERENCE TO RELATED CASES

The present application claims the benefit of the filing date of U.S. Provisional Application Serial No. 60/289,920; filed May 10, 2001.

BACKGROUND OF THE INVENTION

The present invention relates broadly to electromagnetic interference (EMI) shielding enclosures, such as cases, housings, or parts thereof such as covers, for mobile, i.e., cellular telephone handsets and other electronic devices, and particularly to the manufacture of such enclosures as having a metallized shielding layer which is both conformal and corrosion resistant.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and typically is configured as an electrically conductive and grounded housing which encloses the device. The housing may be formed of a metal such as steel, aluminum, or magnesium, or alternatively, of a plastic or other polymeric material which is loaded with a metal or other electrically-conductive filler or which is provided with a metal or other conductive layer fastened, over-molded, spray painted, dip coated, clad, electrolessly or electrolytically plated, thermal or vacuum metallized, or otherwise generally applied or deposited across the interior surfaces of the housing. The conductive layer may be an electrically-conductive paint, a conductively-filled, molded elastomeric layer, a metal foil laminate, transfer, or liner, a metal plating, or a flame, arc, or other thermally-sprayed metal. A conductive gasket may be used to provide electrical continuity between the coating layers applied to the various mating housing parts. Such housings and methods are further described in commonly-assigned U.S. Pat. No. 5,566,055, in DE 19728839, U.S. Pat. Nos. 5,847,317; 5,811,050; 5,442,153; 5,180,639; 5,170,009; 5,150,282; 5,047,260; 4,714,623; and WO 00/29635; 99/43191; 99/40769; 98/54942; 98/47340; 97/26782, and in the following publications of the Chomerics Division of Parker Hannifin Corporation (Woburn, Mass.): "CHO-SHIELD® Conductive Compounds;" "CHO-SHIELD® EMI Shielding Covers," Technical Bulletin 22, (1996); "CHO-VER SHIELD™ EMI Shielding Plastic Cover with Molded Conductive Elastomeric Gasket," (1999); "CHO-SHIELD® 2052 Conductive Coating," Technical Bulletin 48, (2000); "CHO-SHIELD® 2054 Conductive Coating," Preliminary Product Data Sheet, (2000); and "CHO-SHIELD® 2056 High Performance Conductive Coating," Preliminary Product Data Sheet.

As to thermal spray processes, such processes have been used to apply metal and other coatings to a variety of substrates including metal, ceramic, and plastic. In general, by heating and accelerating particles of one or more materials to form a high-energy particle stream, thermal spraying provides a method by which materials supplied in wire or powder form may be rapidly deposited on a substrate. While a number of parameters dictate the composition and microstructure of the sprayed coating or article, the velocity and temperature of the particles as they impact the substrate often are the determining factors controlling the density and uniformity of the deposition.

One thermal spray process known as "flame spraying" or "metallizing" employs a combustion flame to spray metals and other materials in powder, wire, or rod form onto a metal, plastic, or ceramic substrate. A mixture of a fuel gas such as acetylene, kerosene, propylene, or hydrogen, and an oxygen-containing gas (oxy-fuel) are flowed through a nozzle and ignited within a combustion chamber or at the nozzle tip. The material to be sprayed, which typically is zinc, steel, bronze, molybdenum, aluminum, nickel, or aluminum, but which may be a ceramic, cermet, or a thermoplastic, is metered into the flame where it is heated, and is then atomized using compressed air or another gas to form a fine, molten spray which is propelled to the surface of the substrate. The droplets solidify upon contact with the substrate to form a coating. In a wire spray technique, the feedstock comprises a metal rod or wire which is passed axially or tangentially into the center of the flame front. In a powder spray variation, a metal powder is injected axially into the flame front by means of a carrier gas or by a gravity feed.

Conventional flame spraying is typically a low velocity thermal spray process in the subsonic range and usually produces coatings which have a high degree of porosity. More recently, and as is further described in WO 00/29635, the use of a high velocity oxygen flame (HVOF) has been proposed to improve coating density by accelerating the spray to Mach speeds.

Another thermal spray process known as "plasma spraying" utilizes a high-velocity gas plasma to spray a powdered or other particulate material onto a substrate. To form the plasma, a gas such as argon, nitrogen, hydrogen, or helium, is flowed through the nozzle of a plasma spray gun having an anode and cathode. A potential difference is applied to develop an arc between the electrodes. Resistive heating by the arc causes the gas to ionized into a high-temperature, e.g., 10,000° C. or higher, plasma stream. The powder or other particulate to be sprayed is entrained in the plasma and accelerated towards the substrate at a high velocity which may exceed Mach 1.

In another thermal spray technique known as "arc spray" which is further described in U.S. Pat. Nos. 3,546,415 and 4,668,852, two consumable solid or composite wires are employed as electrodes. An electric arc developed in an "arc zone" between the tips of the wires causes the wires to heat and melt. As the wires melt, the arc is maintained between the tips by the continuous feed of the wires. The molten metal at the wire tips is atomized by a one or more streams of compressed air or another gas, and is accelerated by the gas to a substrate. The molten particles impacting the substrate rapidly solidify to form a coating. Alternatively, the arc spay technique may use non-consumable electrodes and instead, with metallized material being introduced into the arc zone as a powder. Conventional arc spray coatings are known to be generally dense and free of oxide.

Heretofore, a number of approaches have been tried to solve the problem of applying metallized coatings onto metal or plastic housings and other enclosures for electronic device. A preferred method would be economical and reliable, and further would produce EMI shielding coatings which are both corrosion resistant and conformal for covering ribs, walls, and other structures, irregularities, or discontinuities which may be molded or otherwise formed in the enclosure.

BROAD STATEMENT OF THE INVENTION

The present invention is directed to an electromagnetic interference (EMI) shielded enclosure, such as a case, housing, or a part thereof such as a cover, for mobile telephone handsets and other electronic devices. More particularly, the invention relates to an electrically-conductive, metallic or "metallized" coating layer for such enclosures which is conformally applied by means of a thermal spray process to an interior surface of a metal or plastic enclosure or enclosure part, such coating layer providing EMI shielding and also corrosion protection.

In an illustrative embodiment, the coating layer is formed by the electric arc spraying of tin, nickel, or an alloy thereof onto the surface of a enclosure part which may be diecast, stamped, machined or otherwise formed of a metal such as aluminum, steel. zinc, or magnesium, or which may be molded of a plastic material such as a polycarbonate (PC), acrylonitrile-butadiene-styrene (ABS), PC/ABS blend, polysulfone, acrylic, polyvinyl chloride (PVC), polyphenylene ether (PPE), polystyrene (PS), polyamide, nylon, polyolefin, or a copolymer or blend thereof. The coating layer so formed is self-adherent and conforms to ribs, wall, and other structures, irregularities, or discontinuities which may be formed enclosure part surface. An electrically-conductive gasket may be dispensed or molded onto the part as chemically-bonded or otherwise self-adhered to the coating layer. Alternatively, the gasket may be adhesively bonded onto the coating layer or mechanically fastened to the part over the coating layer.

Advantageously, the metallized coating layer may be formed by a electric arc thermal spray process which is well-characterized so as to be both economical and reliable. Moreover, by virtue of the use of tin, nickel, or an alloy thereof, the coating layer may afford the enclosure with increased corrosion resistance. The metallized coating layer also is compatible with convention EMI shielding gasket materials such as metal-filled urethanes, silicones, and other elastomeric resin which may be molded or dispensed on and self-adhered to the coating layer. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
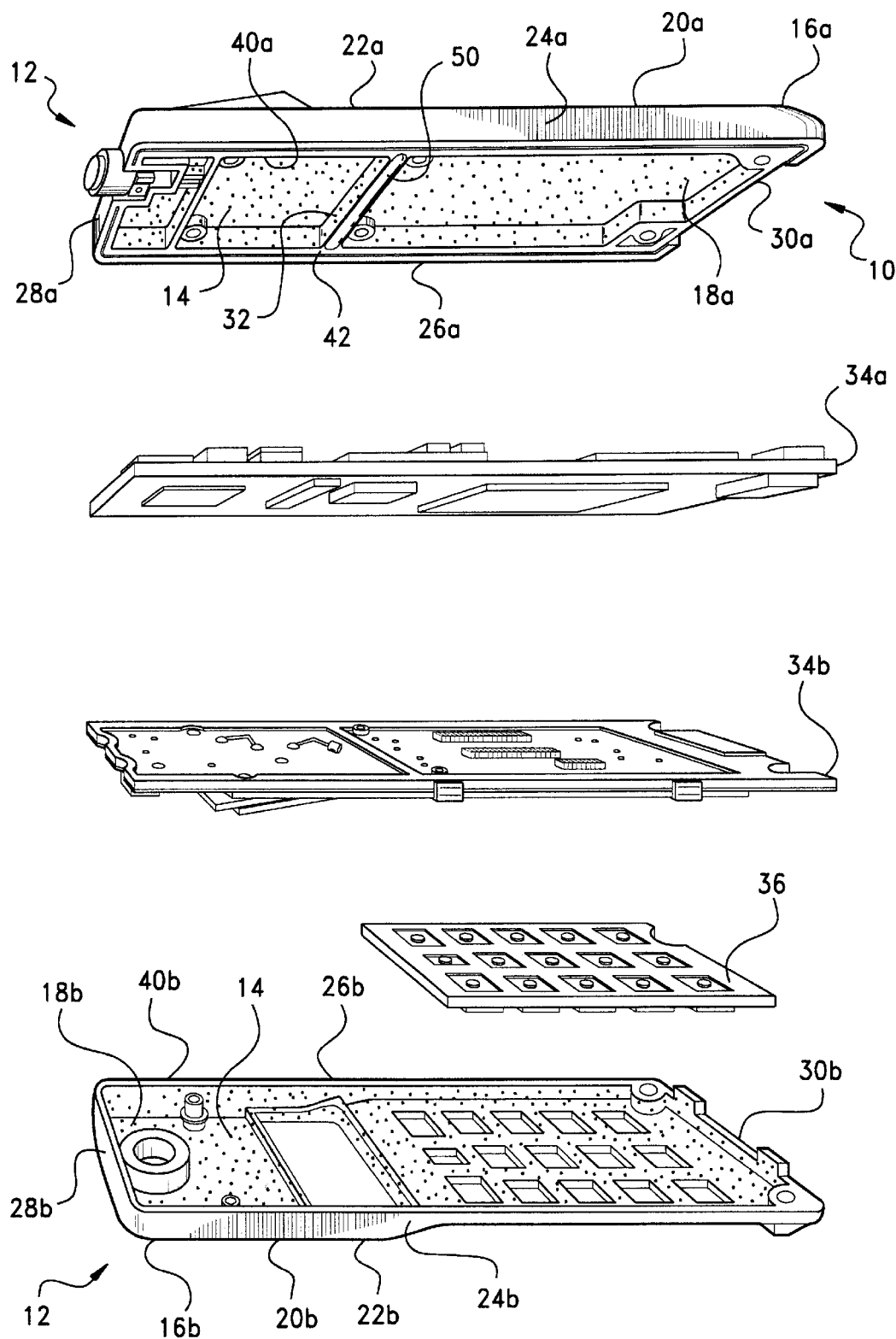
FIG. 1 is an exploded perspective end view of a handheld electronic communication device representative of a typical application for the EMI shielding enclosure herein involved.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the present invention are described in connection with the application of the metallized shielding layer involved as sprayed on the interior surface of a front or back cover part of a housing, case, or other enclosure for a handheld electronic communication device such as a mobile, i.e., cellular, telephone. For the purposes hereof, the term "EMI shielding" should be understood to include, and to be used interchangeably with, electromagnetic compatibility (EMC), surface grounding, corona shielding, radio frequency interference (RFI) shielding, and anti-static, i.e., electro-static discharge (ESD) protection. In view of the discourse to follow, however, it will be appreciated that aspects of the present invention may find utility in other applications, such as for other electronic devices, including indoor or outdoor cabinets, requiring both EMI shielding. Use within those such other applications therefore should be considered to be expressly within the scope of the present invention.

Referring then to the figures, an exemplary electronics device is shown generally at 10 in the exploded perspective view of FIG. 1 as including a case, housing, or enclosure, reference generally at 12, which is adapted in accordance with the precepts of the present invention as having a metallized EMI shielding layer, 14. For purposes of illustration, device 10 is shown to be a mobile telephone handset, but alternatively may be another handheld, portable, or other electronics device such as a personal communications services (PCS) handset, PCMCIA card, modem, wireless communication base station, telemetry device, global positioning system (GPS), radio receiver, personal digital assistant (PDA), notebook or desktop personal computer (PC), cordless telephone handset, network router or server, medical electronics device, or the like. Enclosure 12 is shown to be of a 2-part construction including a back cover, 16a, and a front cover, 16b, each of the parts 16a–b having a corresponding interior surface, 18a–b, and an exterior surface, 20a–b, which extend coterminously to form adjoining back and front walls, 22a–b, side walls, 24a–b and 26a–b, and end walls, 28a–b and 30a–b. Typically, the interiors of one or both of the enclosure parts 16 are divided or partitioned, such as by the wall referenced at 32 for part 16a, into one or more separate cavities for providing electromagnetically isolated compartments for the circuitry of the device 10. As is shown, enclosure 12 may house one or more printed circuit boards (PCBs), 34a–b, or other circuitry or parts, such as a keypad, 36, of the device 10.

The interior surfaces 18 of the parts 16a–b also extend to define interface surfaces, 40a–b, about the perimeter of each of the enclosure parts 16, and also, as is referenced at 42 for wall 32, on the internal walls or other partition structures formed within the parts 16. The interface surfaces 40 and 42 are configured for abutting or other direct or indirect contact engagement with a mating interface surface of the other enclosure part 16, or with a corresponding interface or ground trace surface of a PCB 34 or other part of the device 10. A compressible gasket or other seal, a length of which is shown at 50 as bonded or otherwise supported on interface surface 42, may be interposed between the mating interface or ground trace surfaces. Depending upon the requirements of the application, gasket 50 may extend continuously or discontinuously over all or a portion of the interface surfaces 40 and 42 on one or both or the parts 16a–b. Typically, gasket 50 will be formed of a electrically-conductive material or composite material structure to provide electrical continuity and, optionally, environmental sealing between the mating parts.

Enclosure parts 16a–b, which may be formed of the same or different materials, may be diecast, stamped, or machined of a metal material such as aluminum, zinc, magnesium, steel, or a mixture or alloy thereof. Alternatively, for may handheld or portable applications, parts 16 may be injection molded, thermoformed, or otherwise formed of a plastic, which may be thermoplastic or thermoset, or other polymeric material such as a polycarbonate, acrylonitrile-butadiene-styrene, polysulfone, acrylic, polyvinyl chloride, polyphenylene ether, polystyrene, polyamide, nylon, polyolefin, poly(ether ether ketone), polyimide, polyetherimide, polybutylene terephthalate, polyethylene terephthalate, fluoropolymer, polyester, acetal, liquid crystal polymer, polymethylacrylate, polyurethane, polyphenylene oxide, polystyrene, epoxy, phenolic, or a copolymer or blend thereof. In the case of an electrically-nonconductive material, the housing part inner surface 14 may be painted, metallized, or otherwise provided with a metal or metal-filled coating layer. Alternatively, housing part 12 may be formed of a relatively lightweight metal such as magnesium or aluminum.

Figure 2:
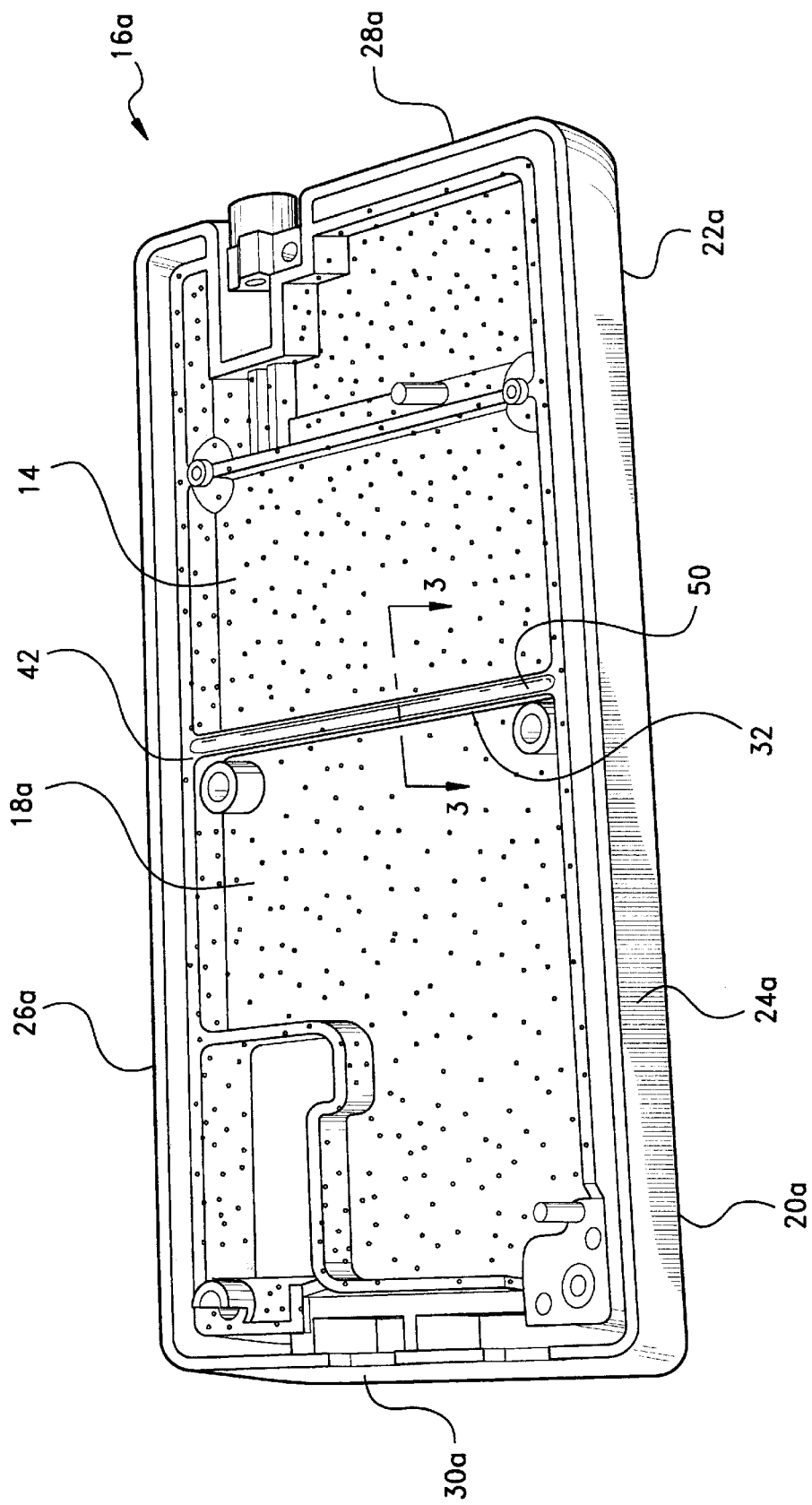
FIG. 2 is a perspective view of a back cover of the shielding enclosure of FIG. 1 showing the interior surface thereof as having a thermal spray-applied metallized coating layer in accordance with the present invention.
Figure 3:
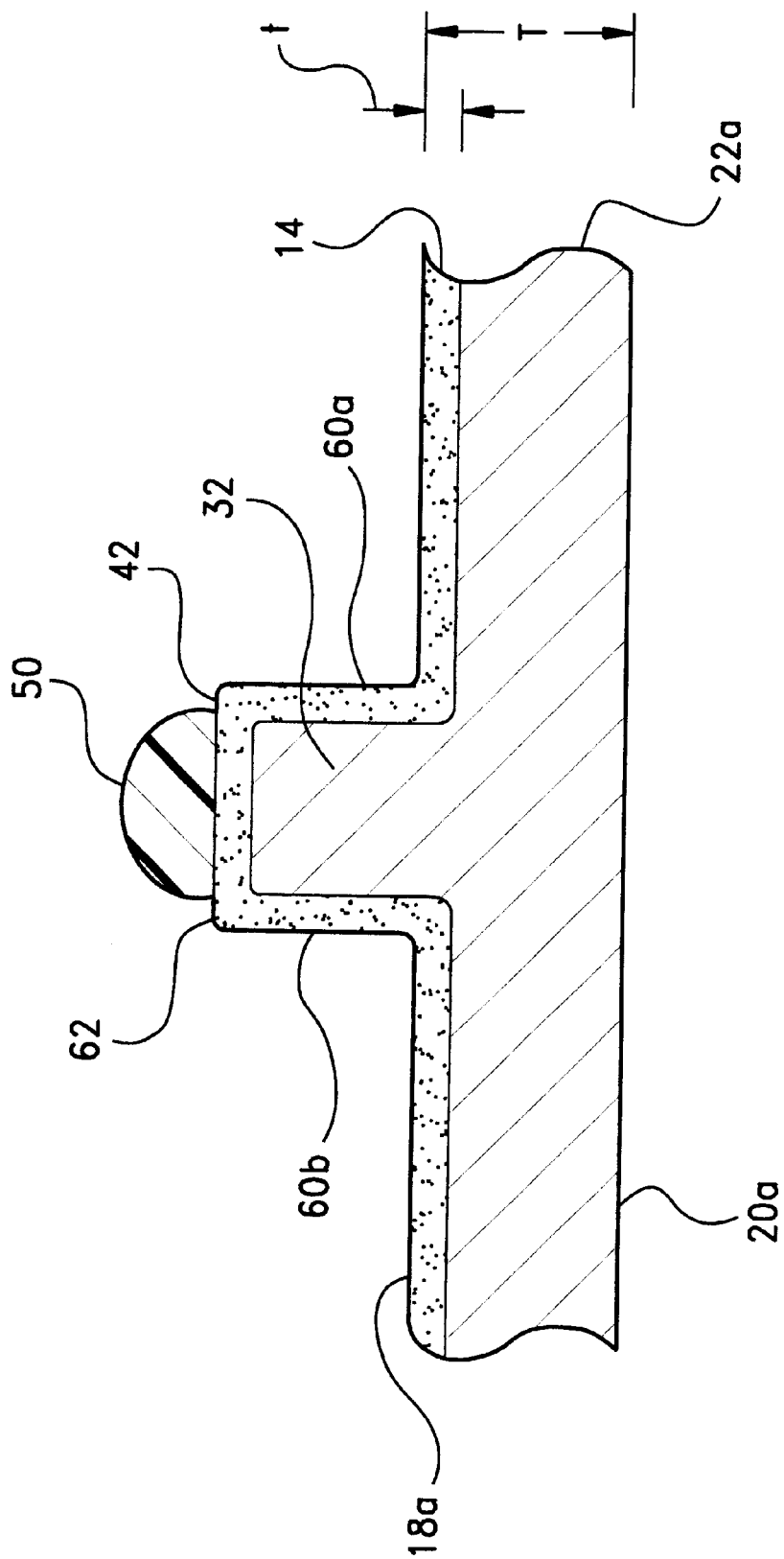
FIG. 3 is a cross-section view of the enclosure part of FIG. 2 taken through line 3—3 of FIG. 2.

As the plastic material forming the enclosure parts 16 will generally be non-electrically conductive, or in the case of metal parts 16 covered with a non-conductive paint or otherwise requiring an electrically-conductive, corrosion-resistant surface, shielding layer 14 is provided, as may be seen with additional reference to FIG. 2 wherein enclosure part 16a is shown in enhanced detail and to the magnified cross-sectional view thereof of FIG. 3, as an adherent, electrically-conductive film or other coating or the like which is applied as an EMI shielding layer to cover at least a portion of one or both of the interior surfaces 18a–b of the corresponding enclosure part 16a–b. For most applications, shielding layer 14 will have a film thickness, referenced at "t" in FIG. 3, of between about 1–100 mils (0.025–2.5 mm), with the enclosure parts 16a–b having a thickness, referenced at "T" in FIG. 3 of between about 0.020–0.250 inch (0.05–1 cm).

In an illustrative embodiment, metallized shielding layer 14 is thermally-sprayed, such as by means of standard arc wire equipment, onto at least a portion of and, typically, substantiality the entirety of the interior surfaces 18 and interface surfaces 40 and 42 of the parts 16a–b. For corrosion resistance, layer 14 may be formed of tin, nickel, or an alloy thereof. Typically, the composition of layer 14 may comprise between about 80–95% by weight of tin or nickel, with the balance being between about 5–20% by weight of or more of zinc, copper, or aluminum. Trace amounts of other metals, elements, and organic or inorganic compounds also may be present. A preferred material for layer 14 is a tin-based Babbit metal comprising about 85% tin and about 14% zinc, the balance being trace metals, elements, or compounds. Such material is both economical and provides a corrosion-resistant coating on surface 18. By "corrosion-resistant," it is meant that the shielding layer 14 is more corrosion resistant than the zinc flame sprayed coatings heretofore known in the art. In this regard, layer 14 typically will exhibit a less than about 5–15% increase in surface resistance upon exposure to a salt-fog environment for about 48 hours at about 35° C. Layer 14 similarly will be observed to exhibit substantially no increase in surface resistance following a thermal cycling of at least about 5 cycles at −40° C. to 85° C. with a dwell time of about two hours at each of the upper and lower temperature limits.

Advantageously, as thermally-sprayed in accordance with the present invention, shielding layer 14 is self-adherent to interior surface 18 as being bonded thereto. Such bond principally will be by way of mechanical forces, but additionally may include fusion or chemical bonding, and/or electrostatic, van der Waals, or other valance or attractive forces depending upon the composition and the compatibility of the metal or plastic material forming surface 18 and the metal material forming the metallized layer 14. Typically, layer 14 will be observed to have an assigned rating of about "5," i.e., substantially no coating pickoff, as determined on a scale of 0B–5B in accordance with ASTM Test Method D3359-97, "Standard Test Methods for Measuring Adhesion by Tape Test," in which the adhesion of coatings is assessed by applying and removing pressure-sensitive tape over cross-hatch cuts made in the coating.

Prior to the metallizing of layer 14 thereon, surface 18 may be cleaned and/or roughened such as by one or more of compressed gas, chemical or solvent etching/cleaning, grit-blasting, such as with aluminum oxide or another abrasive, or other known surface treatment. Alternatively, a chemical bond coat, such as a thermoplastic dissolved in a solvent, may be applied to the surface 18 and dried or otherwise cured thereon to form an intermediate tie layer between the surface and the metallized layer 14. A preferred surface preparation, however, involves cleaning and/or etching or otherwise modifying the of the surface 18 with a plasma generated from the ionization of oxygen, argon, or another gas or mixture of gases.

Although the metallizing may be effected an elevated substrate temperature, surface 18 typically will be at ambient temperature so as to avoid heat distortion and other dimensional, physical, or chemical changes in the substrate material. Depending upon the requirements of the particular application involved, areas of surface 18 may be masked, such as by means of a overlay cut-out, to prevent the deposition of shielding layer 14 on those areas. As mentioned, and as may be seen best in the cross-sectional view of FIG. 3, the shielding layer 14 formed in accordance with the present invention is conformal in that it is able to cover ribs, stiffeners, bosses, deep draws, vertices, and other surface asperities, irregularities, or discontinuities, such as the generally vertical surfaces 60a–b of wall 32.

With continuing reference to FIG. 3, gasket 50 may be seen to be disposed following the metallization of surface 18 on the portion 62 of layer 14 covering the interface surface 42. Such gasket 50 may be provided as having a resilient core element affording gap-filling capabilities which is either loaded, sheathed, or coated with an electrically conductive element. The resilient core element, which may be foamed or unfoamed, solid or tubular, typically is molded, extruded, die-cut, or otherwise formed of an elastomeric thermoplastic material such as a polyolefin, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a over-molded or formed-in-place (FIP) bead of a curable, electrically-conductive silicone or urethane composition. As to an FIP construction, the composition is dispensed in a fluent state onto the surface 42 and the layer 14 portion 62 thereon, then is cured or foamed in situ via the application of heat or with atmospheric moisture, UV, radiation, or other energy sources.

Means of securing gasket 50 to the layer portion 62 include pressure-sensitive adhesive tapes or other layers (not shown), which may be filled to be electrically conductive, interposed between the layer 14 portion 62 and the gasket. Alternatively, mechanical means of attachment such as clips, fasteners, or a tough-in-groove or other interference fit may be employed. In the case of an over-molded or FIP construction, the gasket 50 may be self-bonded by chemical, mechanical, or other adhesive forces to the layer 14 portion 62. EMI shielding gaskets and their methods of manufacture and use are further described in U.S. Pat. Nos. 6,121,545; 6,096,413; 5,910,524; 5,882,729; 5,731,541; 5,641,438; 5,603,514; 5,578,790; 5,566,055; 5,524,908; 5,522,602; 5,512,709; 5,438,423; 5,202,536; 5,142,101; 5,115,104; 5,107,070; 5,105,056; 5,068,493; 5,028,739; 5,008,485; 4,988,550; 4,968,854; 4,952,448; 4,857,668; and 3,758,123, and in WO 96/22672 and 98/54942; Japanese Patent Publication (Kokai) No. 7177/1993; DE 19728839, and Severinsen, J., "Gaskets That Block EMI," Machine Design, Vol. 47, No. 19, pp. 74–77 (Aug. 7, 1975).

Figure 4:
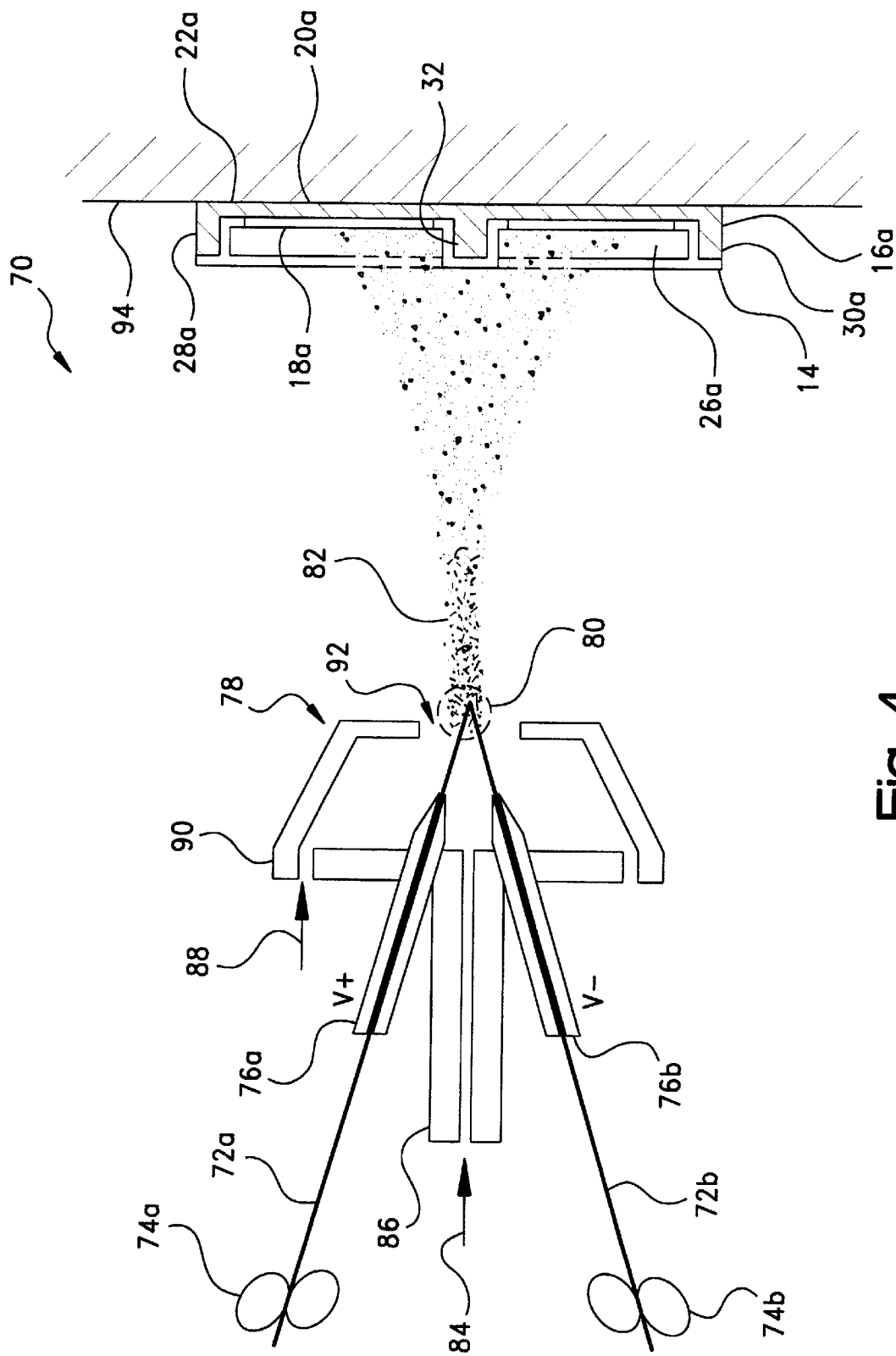
FIG. 4 is a schematic plan view of a representative electric arc thermal spray system for forming the metallized coating layer of FIGS. 2 and 3.

Turning next to FIG. 4, a schematic diagram of a representative arc wire system adapted for the thermal spraying of shielding layer 14 onto interior surface 18a of enclosure part 16a is referenced generally at 70. In the system 70, a pair of electrically-conductive, consumable wire electrodes, 72a–b, are feed via a corresponding roller arrangement, 74a–b, or other mechanism through a pair of contact tubes, 76a–b, which may be housed within a nozzle, referenced generally at 78, of a gun or other spray head. Each of the wire electrodes 72, which may be of the same or difference composition, may be provided in accordance with the present invention as formed of the tin, nickel, or alloy metal further described hereinbefore. The wire sizes and feed rates may be varied depending on the application, but generally would be considered conventional for the arc wire process herein involved.

With one of the contact tubes 76a–b being held, for example, at a positive voltage potential, such as is referenced at $V_+$, and with the other of tubes 76a–b being held at a negative voltage potential, such as is referenced at $V_-$, a corresponding electrical potential difference may be induced in the wire electrodes 72 by virtue of their conductive contact with an associated on of the tubes 76. Such potential difference is manifested as an electric arc which is generated within a gap or "arc zone," located generally in the area referenced at 80, maintained between the tips of the wires 72. As the wires 72 are feed continuously into the arc zone, heat generated resistively by the arc raises the temperature of the wires to above their corresponding liquidus temperature, typically between about 200–500° C., and thereby causes the tips of the wires to melt. The melt produced is atomized into a spray, 82, of droplets by a primary gas stream, the direction of which is denoted by the arrow 84, which stream 84 may be compressed air supplied into the arc zone 80 through a centrally-located tube or other passageway, 86. Additional atomization or containment of the spray 82 may be effected by a secondary gas stream, the direction of which is denoted by the 88, which stream 88 my be introduced within a shield, 90, which surrounds the orifice or outlet, 92, of the nozzle 78.

The force of the atomizing gas streams 84 and 88 also accelerates the droplets of the spray 82 towards the workpiece, represented in FIG. 4 by the housing part 16a of FIGS. 1–3, which may be positioned a spaced-apart distance, typically between about 4–24 inches (10–60 cm), opposite the nozzle 78 as received on a table, conveyor, or other support, 94. As is known, one or both of the nozzle 78 or workpiece 16a may be moved relative to other to provide complete coverage of the substrate surface 18 by the spray 82. For example, the nozzle 78 may be mounted for movement along one or more axes on a gantry or an articulated robotic arm. The molten droplets of spray 82 solidify and fuse rapidly upon impact with the surface 18 to form an adherent coating of the shielding layer 14 of the invention thereon. Depending upon the thickness of the layer 14 required, single or multiple passes of the spray 82 over the surface 18 may be performed.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A method of EMI shielding a part of an enclosure for housing circuitry in an electronic device, the enclosure part having an exterior surface and an opposing interior surface, and said method comprising the steps of:

(a) providing a feed material comprising tin, nickel, or an alloy thereof;

(b) heating said feed material of step (a) into a molten state;

(c) atomizing said feed material of step (b) while in said molten state;

(d) spraying the atomized feed material of step (c) while in said molten state on at least a portion of the interior surface of the enclosure part to form a conformal coating of said metal thereon; and (e) solidifying said coating of step (d) to form an electrically-conductive, corrosion-resistant, self-adherent EMI shielding layer on said portion of said interior surface.

2. The method of claim 1 wherein said housing part is formed of a metal.

3. The method of claim 2 wherein said metal is aluminum, zinc, magnesium, steel, or a mixture of alloy thereof.

4. The method of claim 1 wherein said housing part is formed of a plastic.

5. The method of claim 2 wherein said plastic is polycarbonate, acrylonitrile-butadiene-styrene, polysulfone, acrylic, polyvinyl chloride, polyphenylene ether, polystyrene, polyamide, nylon, polyolefin, poly(ether ether ketone), polyimide, polyetherimide, polybutylene terephthalate, polyethylene terephthalate, fluoropolymer, polyester, acetal, liquid crystal polymer, polymethylacrylate, polyurethane, polyphenylene oxide, polystyrene, epoxy, phenolic, or a copolymer or blend thereof.

6. The method of claim 1 wherein said shielding layer of step (e) exhibits an EMI shielding effectiveness of at least about 60 dB substantially over a frequency range of between about 10 MHz and about 2 GHz.

7. The method of claim 1 wherein said shielding layer of step (e) has an electrical surface resistance of not greater than about 0.10 Ω/sq.

8. The method of claim 1 wherein said shielding layer of step (e) has a thickness of between about 1–100 mils (0.025–2.5 mm).

9. The method of claim 1 wherein said feed material comprises between about 80–95% by weight of nickel or tin and between about 5–20% by weight of one or more of zinc, copper, or aluminum.

10. The method of claim 1 wherein said feed material is heated in step (b) by generating an electric arc within an arc zone, and passing said feed material through said arc zone.

11. The method of claim 10 wherein:
said feed material is atomized in step (c) and by a gas stream passed with said feed material through said arc zone; and
said feed material is sprayed in step (d) by entrainment within said gas stream.

12. The method of claim 10 wherein:
said feed material is provided as a first wire and a second wire, each said wire being passed with the other said wire through said arc zone; and
wherein said arc is generated by applying an electrical potential difference between said first and said second wire.

13. The method of claim 1 wherein:
said atomized feed material is prayed in step (d) on substantially the entirety of the interior surface of the enclosure part; and
said coating is solidified in step (d) to form said shielding layer on substantially the entirety of the interior surface of the enclosure part.

14. The method of claim 1 wherein:
said interior surface of the enclosure part has a structure formed therein;
said atomized feed material is prayed in step (d) on said structure; and
said coating solidified in step (d) conforms to said structure.

15. The method of claim 1 wherein said interior surface of the enclosure part defines an interface surface with another part of the device, said atomized feed material is prayed in step (d) on said interface surface, and said coating is solidified in step (d) to form said shielding layer on said interface surface, said method further comprising the additional step of:
(f) disposing an electrically-conductive gasket on said enclosure part, said gasket being supported on the shielding layer formed on said interface surface and being compressible therebetween and said another part of the device.

16. The method of claim 15 wherein said gasket of step (f) comprises of a blend of a elastomeric resin and an electrically-conductive filler.

17. The method of claim 16 wherein said gasket is disposed on said enclosure part in step (f) as over-molded or formed-in-place on the shielding layer formed on said interface surface.

18. The method of claim 16 wherein said gasket of step (f) is self-adherent to the shielding layer.

19. The method of claim 1 wherein said interior surface and said exterior surface of the enclosure part defines a wall of said enclosure part therebetween, said wall having a thickness of between about 0.020–0.250 inch (0.05–1 cm).

20. The method of claim 1 wherein said coating layer of step (e) has an adhesion on the interior surface of the enclosure part of about 5B as rated in accordance with ASTM Test Method D3359-97, "Standard Test Methods for Measuring Adhesion by Tape Test."

21. The method of claim 1 further comprising the additional step prior to step (d) of:
exposing the interior surface of the enclosure part to a plasma comprising one or more ionized gases.

22. The method of claim 21 wherein the interior surface of the enclosure part is etched by said exposure to said plasma.

23. The enclosure part which is EMI shielded by the method of claim 1.

24. The enclosure part which is EMI shielded by the method of claim 10.

25. The enclosure part which is EMI shielded by the method of claim 15.

* * * * *